(12) United States Patent
Barina et al.

(10) Patent No.: US 7,558,068 B2
(45) Date of Patent: *Jul. 7, 2009

(54) APPARATUS AND SYSTEM, TO SECURE A HEAT SINK

(75) Inventors: Richard M. Barina, Sebring, FL (US); Dean F. Herring, Yonngville, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/023,652

(22) Filed: Jan. 31, 2008

(65) Prior Publication Data

US 2008/0130236 A1 Jun. 5, 2008

Related U.S. Application Data

(63) Continuation of application No. 11/319,900, filed on Dec. 28, 2005, now Pat. No. 7,385,826.

(51) Int. Cl.
*H05K 7/20* (2006.01)
*H05K 7/00* (2006.01)
*F28F 7/00* (2006.01)

(52) U.S. Cl. .............. 361/719; 361/709; 361/747; 174/16.3; 165/80.3

(58) Field of Classification Search ............... 361/704, 361/719, 709, 747; 174/16.3; 165/80.3
See application file for complete search history.

(56) References Cited

U.S. PATENT DOCUMENTS

| | | | |
|---|---|---|---|
| 5,448,449 A | 9/1995 | Bright et al. | 361/704 |
| 5,638,258 A | 6/1997 | Lin | 361/704 |
| 5,671,118 A | 9/1997 | Blomquist | 361/704 |
| 5,678,627 A | 10/1997 | Lee | 165/80.3 |
| 5,791,403 A | 8/1998 | Chiou | 165/80.3 |
| 6,101,091 A | 8/2000 | Baik | 361/704 |
| 6,181,559 B1 | 1/2001 | Seo | 361/704 |
| 6,243,267 B1 | 6/2001 | Chuang | 361/704 |
| 6,549,412 B1 | 4/2003 | Ma | 361/704 |
| 6,618,253 B1 | 9/2003 | Szu et al. | 361/719 |

(Continued)

FOREIGN PATENT DOCUMENTS

JP  2002261212  9/2002

(Continued)

*Primary Examiner*—Jayprakash N Gandhi
*Assistant Examiner*—Bradley H Thomas
(74) *Attorney, Agent, or Firm*—Kunzler & McKenzie

(57) ABSTRACT

An apparatus and system are disclosed for securing a heat sink against a central processing unit. The present invention teaches a heat sink securement device having a vertical retention arm that substantially encompasses a heat sink in a vertical direction, a horizontal retention arm that substantially encompasses a heat sink in a horizontal direction, and a tension arm coupled to the vertical and horizontal retention arms and pivotally coupled to the frame, the tension arm simultaneously adjusts a tension on the vertical retention arm and the horizontal retention arm in response to moving the tension arm. In certain embodiments, the retention arms are coupled to the tension arm via coupling member that is offset from pivot point of the tension arm. In other embodiments, the coupling member may include a different coupling member for the vertical and horizontal retention arms, both coupling members offset from the pivot point.

13 Claims, 9 Drawing Sheets

U.S. PATENT DOCUMENTS

| | | | |
|---|---|---|---|
| 6,625,021 B1 | 9/2003 | Lofland et al. | 361/697 |
| 6,654,254 B2 | 11/2003 | Szu et al. | 361/760 |
| 6,707,672 B2 | 3/2004 | Liu | 361/704 |
| 6,731,504 B1 * | 5/2004 | Liu | 361/704 |
| 6,768,641 B2 | 7/2004 | Li | 361/719 |
| 6,788,538 B1 | 9/2004 | Gibbs et al. | 361/704 |
| 6,822,869 B2 | 11/2004 | Huang et al. | 361/704 |
| 6,826,051 B2 | 11/2004 | Lai et al. | 361/704 |
| 7,013,537 B2 | 3/2006 | Lin et al. | 24/457 |
| 7,046,516 B2 | 5/2006 | Lee et al. | 361/704 |
| 7,061,764 B2 | 6/2006 | Lai et al. | 361/704 |
| 7,167,367 B2 | 1/2007 | Zhang | 361/704 |
| 7,180,746 B2 | 2/2007 | Yu et al. | 361/719 |
| 2005/0259399 A1 | 11/2005 | DelPrete et al. | 361/704 |

FOREIGN PATENT DOCUMENTS

| | | |
|---|---|---|
| JP | 2002261213 | 9/2002 |

* cited by examiner

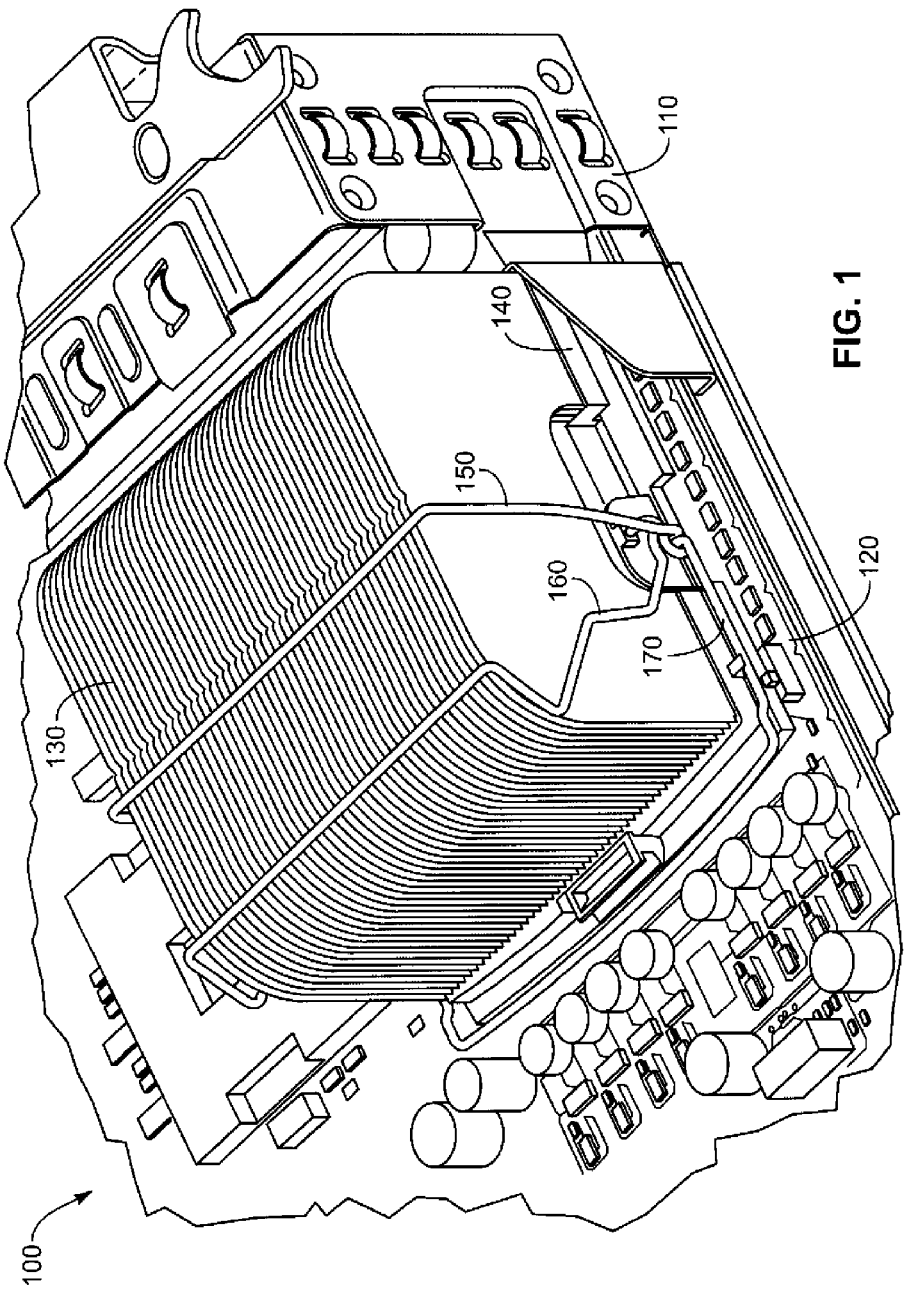

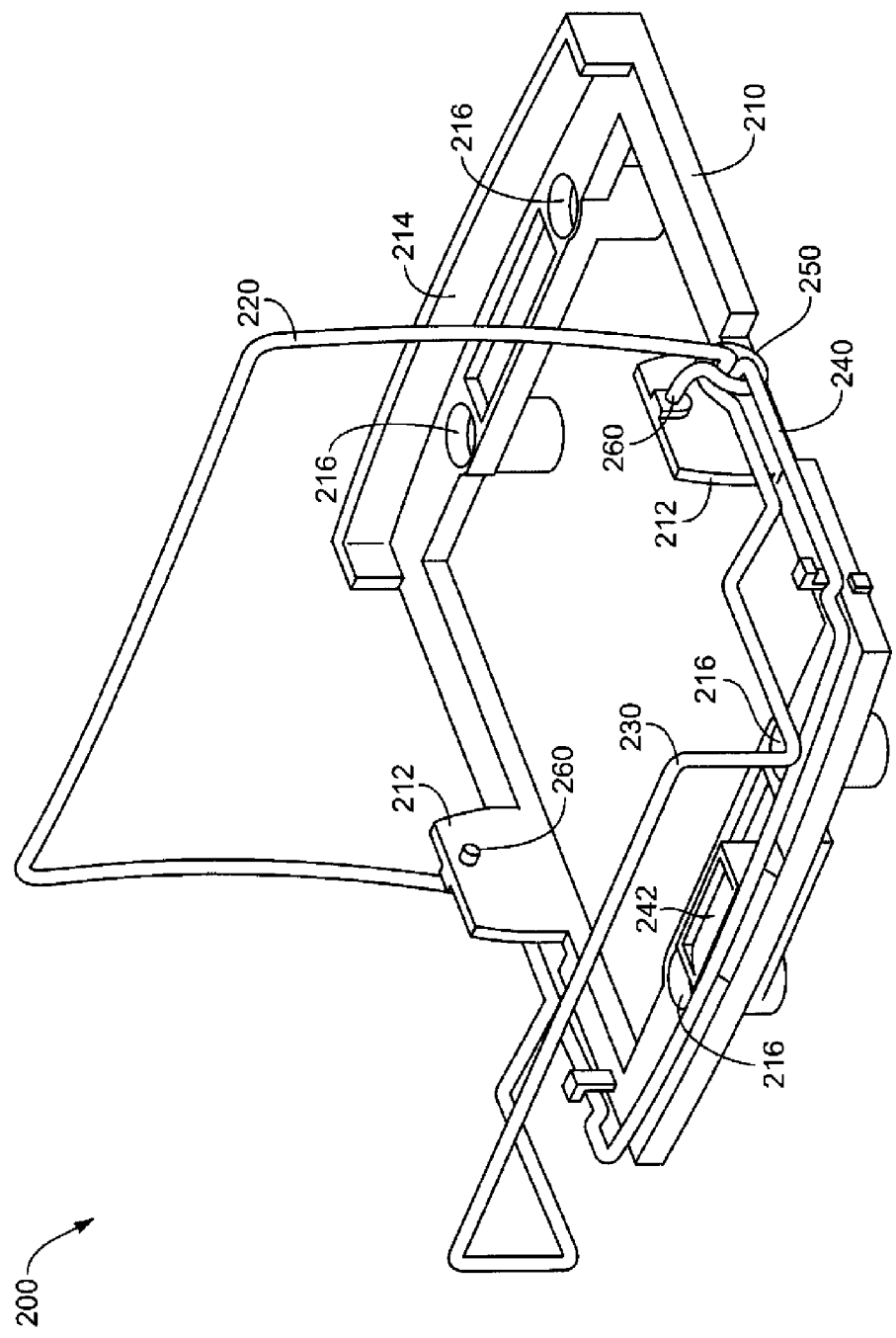

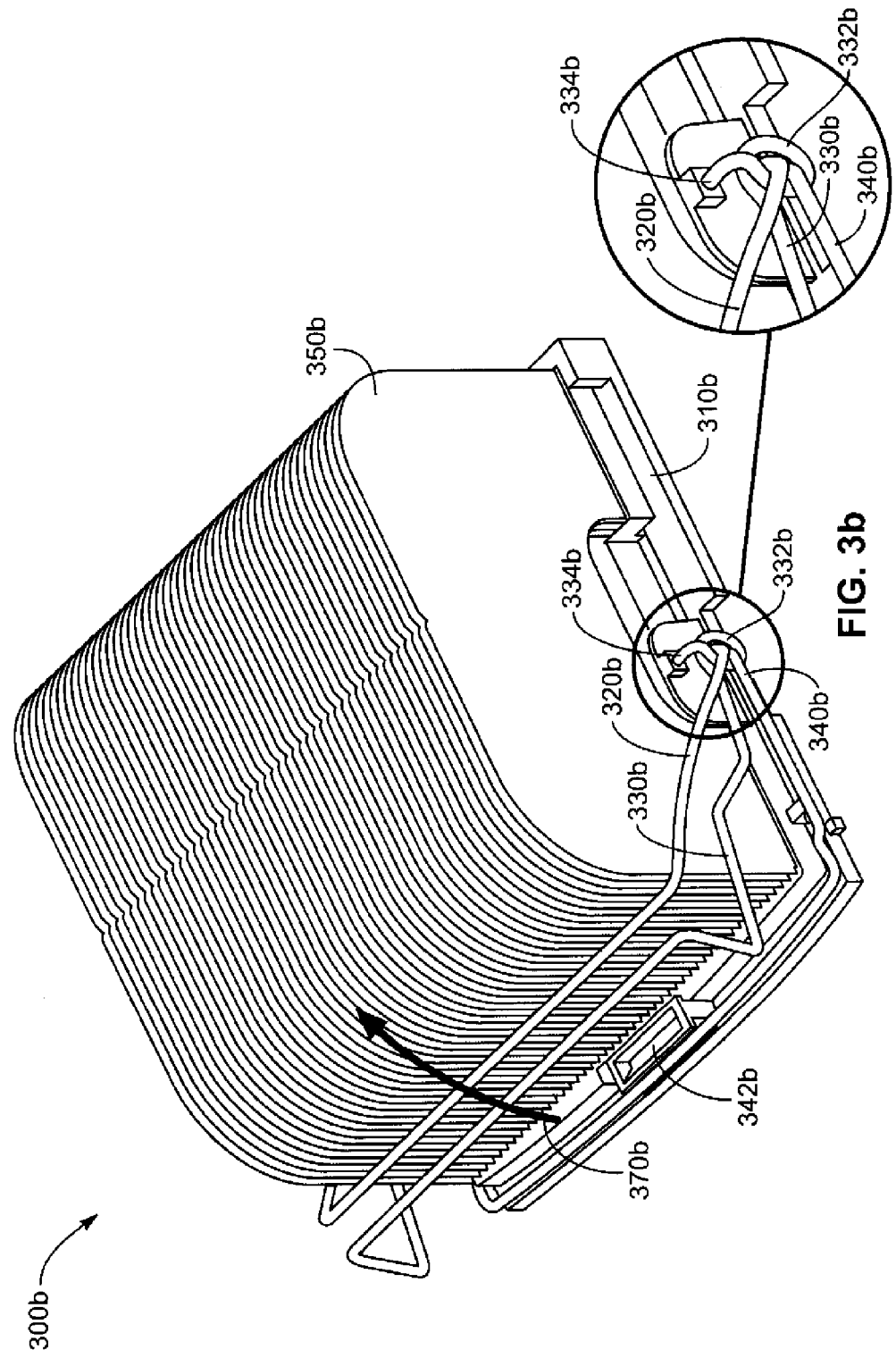

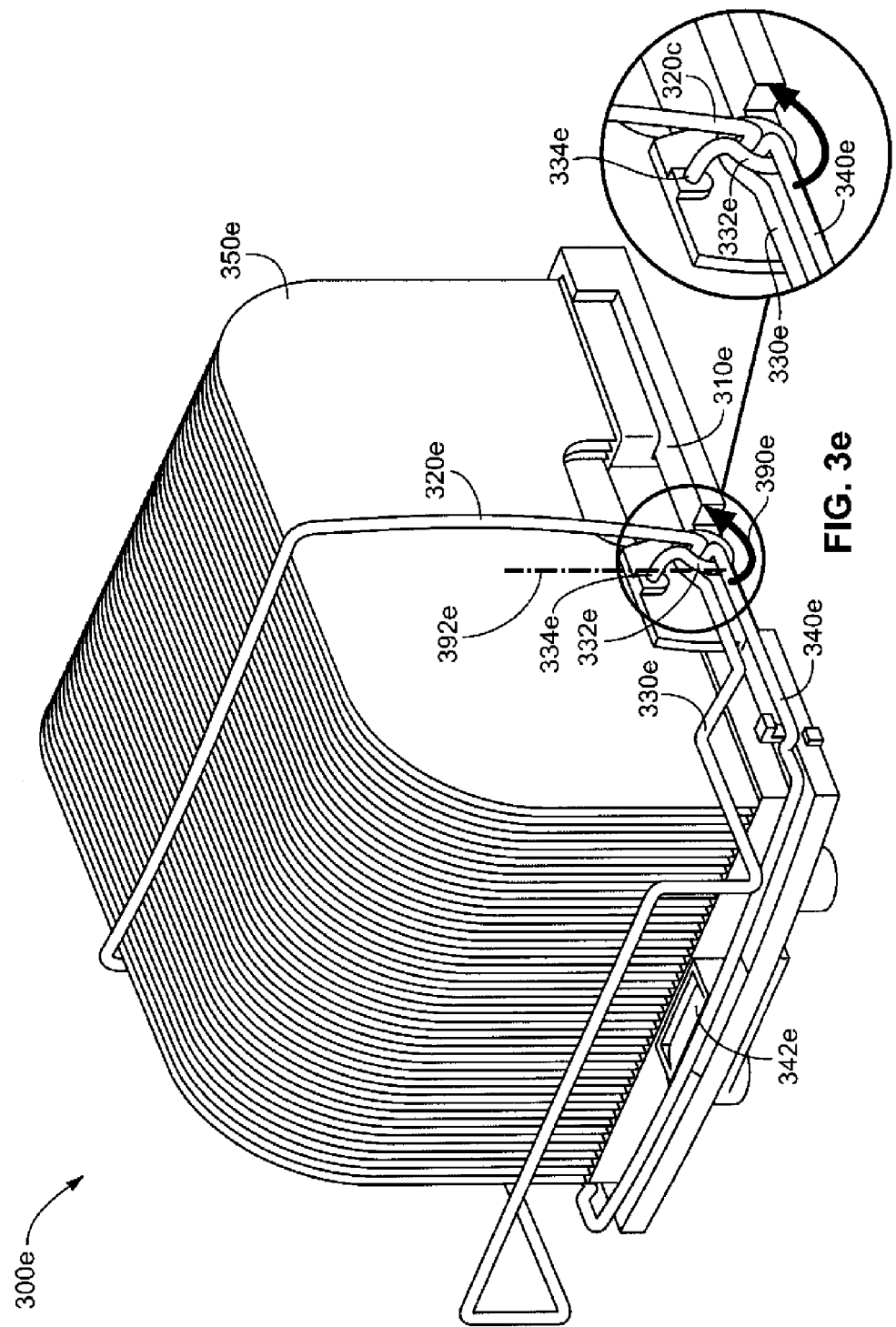

APPARATUS AND SYSTEM, TO SECURE A HEAT SINK

CROSS-REFERENCES TO RELATED APPLICATIONS

This application is a continuation and claims priority to U.S. patent application Ser. No. 11/319,900 entitled "APPARATUS, SYSTEM, AND METHOD TO SECURE A HEAT SINK" and filed on Dec. 28, 2005 for Richard M. Barina, which is incorporated herein by reference.

BACKGROUND OF THE INVENTION

1. Field of the Invention

This invention relates to systems, methods, and apparatuses for handling and packaging high performance integrated circuits such as central processing units (CPUs) and more particularly relates to systems, methods, and apparatuses for securing a heat sink against a high performance integrated circuit.

2. Description of the Related Art

Proper heat sink performance has become an increasingly important subject as a result of the increased device density on integrated circuits and increase packaging density on printed circuit boards. The fundamental role of a heat sink is to cool an integrated circuit by receiving heat from the integrated circuit and transferring the heat to the environment. One example of an integrated circuit that may significantly benefit from cooling is a central processing unit (CPU). Reducing the temperature of the integrated circuit is critical to the performance and life of the CPU. If the heat sink, for some reason, shifts away from the CPU, then the functionality of the integrated circuit is compromised as overheating will inevitably occur. Accordingly, maintaining the proper positioning of the heat sink against the integrated circuit is paramount to ensuring properly function integrated circuits such as CPUs.

In an attempt to ensure proper position of the heat sink, certain approaches been developed. For example, adhesives or epoxy-type grease are sometimes used to thermally join the heat sink to the integrated circuit. Though a simple adhesive may maintain the proper positioning of the heat sink under ideal conditions, during shipment or relocation of the computer, an adhesive may prove insufficiently strong in light of the bumps and shifts of transporting the device. Moreover, the bumps and shifts associated with transporting a computer may be even more of a problem when the heat sink is relatively massive and the need for thermal dissipation is greatest.

Other devices for securing a heat sink to an integrated circuit include complex systems with multiple removable parts. Such systems include screws, brackets, latches, and other mechanisms that may require considerable time to understand and use. Moreover, because these complex systems use removable parts, the probability of loosing a part essential to securing a heat sink is substantially increased.

From the foregoing discussion, it should be apparent that a need exists for an improved system, apparatus, and method for securing a heat sink to a high performance integrated circuit such as a CPU. Beneficially, such a system, apparatus and method would substantially increase the probability of proper heat sink positioning in addition to enabling simple heat sink insertion, securement, and removal.

SUMMARY OF THE INVENTION

The present invention has been developed in response to the present state of the art, and in particular, in response to the problems and needs in the art that have not yet been fully solved by currently available solutions. Accordingly, the present invention has been developed to provide an apparatus, system, and method for securing a heat sink against an integrated circuit that overcome many or all of the above-discussed shortcomings in the art.

The present invention in the described embodiments include a frame, a vertical retention arm that substantially encompasses a heat sink in a vertical direction, a horizontal retention arm configured to substantially encompass a heat sink in a horizontal direction, and a tension arm coupled to the vertical and horizontal retention arms and pivotally coupled to the frame. The tension arm simultaneously adjusts a tension on the vertical retention arm and the horizontal retention arm in response to moving the tension arm. The various components of the present invention cooperate to secure a heat sink against an integrated circuit such as CPU.

In certain embodiments, the tension arm includes a coupling member that couples the vertical retention arm and the horizontal retention arm to the tension arm. In certain embodiments, the coupling member may be a loop. In some embodiments, the coupling member may be offset from a pivot point of the tension arm. Additionally, the coupling member may trace a substantially semi-circular path in response to adjusting the tension arm. In some embodiments the vertical retention arm is pivotally coupled to the tension arm. In certain embodiments, the frame comprises a horizontal brake configured to oppose horizontal motion of a heat sink.

A system of the present invention is also presented for securing a heat sink against an integrated circuit. The system may be embodied as an integrated circuit, a frame, a heat sink, and a heat sink securement device in accordance with the present invention. In certain embodiments, the system may also include a printed circuit board and a computer chassis.

A method of the present invention is also presented for securing a heat sink against an integrated circuit. The method in the disclosed embodiments substantially includes the operations necessary to carry out the functions presented above with respect to the operation of the described apparatus and system. In one embodiment, the method includes providing a frame, substantially encompassing a heat sink in a vertical direction with a vertical retention arm, substantially encompassing a heat sink in a horizontal direction with a horizontal retention arm, coupling the vertical and horizontal retention arms with a tension arm pivotally coupled to the frame, and simultaneously adjusting the tension on the vertical retention arm and the horizontal retention arm by moving the tension arm.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 1 is a perspective view of one embodiment of a heat sink securement system in accordance with the present invention;

FIG. 2 is a perspective view of one embodiment of a heat sink securement apparatus in accordance with the present invention FIG. 3A-3E are perspective views of one embodiment of a heat sink securement apparatus in accordance with the present invention;

DETAILED DESCRIPTION OF THE INVENTION

Figure 3A:
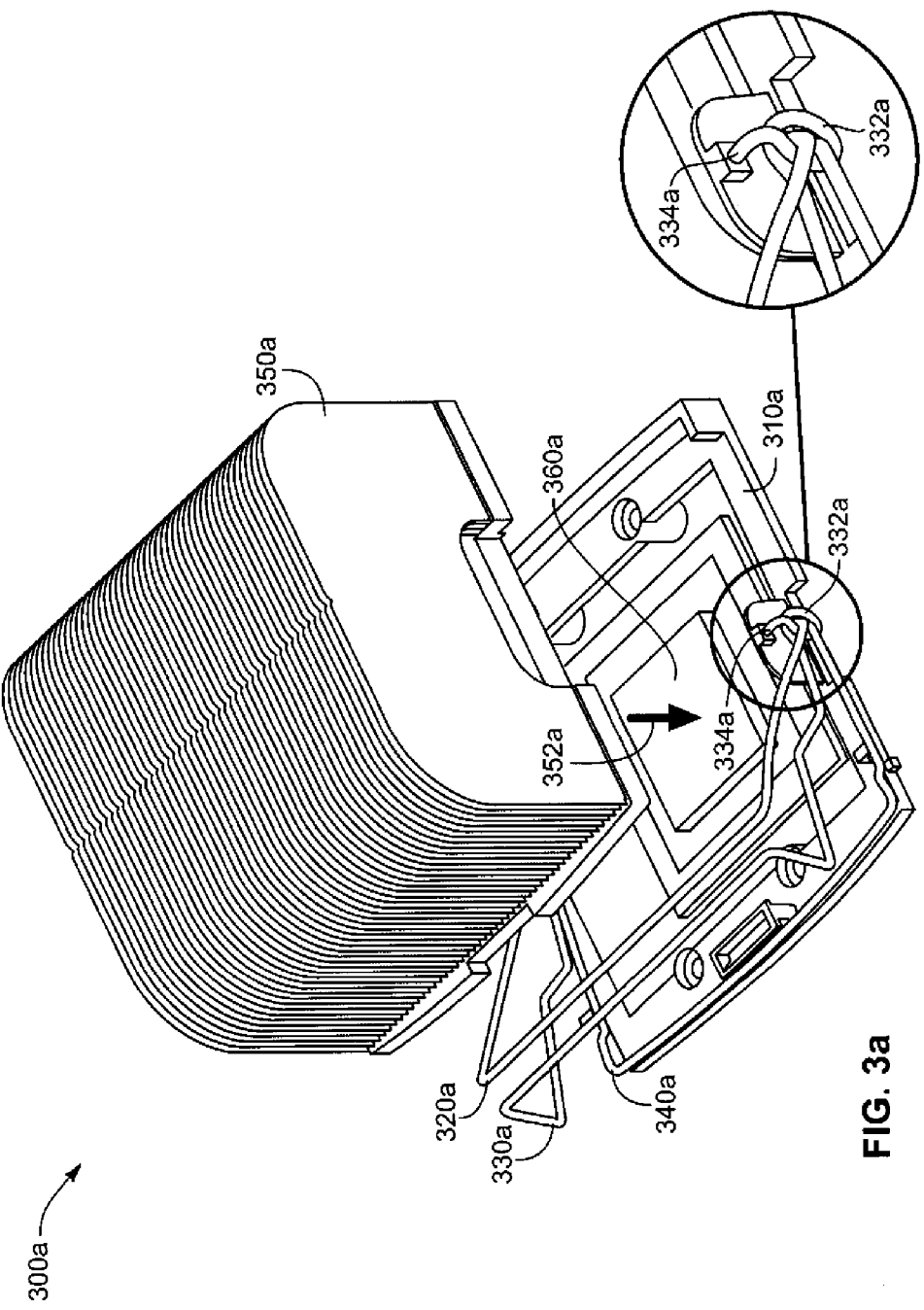

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

FIG. 1 is a perspective view of one embodiment of a heat sink securement system 100. The depicted system 100 includes a chassis 110, a circuit board 120, a heat sink 130, a frame 140, a vertical retention arm 150, a tension arm 160, and a horizontal retention arm 170. The system 100 may also include a high performance integrated circuit such as a CPU (see FIG. 3) positioned underneath the heat sink 130. In certain embodiments, the system 100 may also include a thermally conductive adhesive or grease between the heat sink 130 and the integrated circuit. The various components of the system 100 function cooperatively to secure the heat sink 130 against the integrated circuit.

As will be further detailed in subsequent figures, the vertical retention arm 150 and horizontal retention arm 170 secure the heat sink 130 to the frame 140. The tension arm 160 adjusts the tension of the vertical and horizontal retention arms 150, 170. The frame 140 provides horizontal and vertical boundaries against which the vertical and horizontal arms 150, 170 may secure the heat sink 130.

The frame 140 may be secured to the chassis 110 and, by implication to the circuit board 120 (see FIG. 2 for more detail). Securing the frame 140 to the chassis 110 instead of the circuit board 120 ensures the stability of overall system 100 in addition to avoiding unnecessary stress on the circuit board 120. The frame 140 may be positioned and secured with respect to the circuit board 120 and chassis 110 such that the heat sink 130 may be secured against the integrated circuit (see FIG. 3) once the heat sink 130 is inserted into the frame 140. A power supply (not shown) may provide power to the electronic components of the system 100.

The heat sink 130 cools the operating temperature of the integrated circuit by receiving dissipating heat from the integrated circuit (see FIG. 3). The heat sink 130 may include any variety of heat sink models, types, or makes including heat sinks made of a thermally conductive material such as copper or aluminum. In certain embodiments, the heat sink weighs approximately two (2) to three (3) pounds. The chassis 110 provides stability to the overall system 100. The present invention is not limited to a type or model of chassis, as would be understood by one of skill in the art.

Similarly, the present invention is not limited to a type or model of circuit board, processor board, mother board, etc. Rather, the circuit board 120 may comprise any variety of circuit boards having need of a heat sink. In certain embodiments, the circuit board 120 is sufficiently stiff so as to withstand the downward pressure of the secured heat sink 130 and not bend or contort, and thereby create a space between the heat sink 130 and the integrated circuit. In other embodiments, the circuit board 120 may be supported by the chassis 110 to deter such bending or contortion. Accordingly, the features and details of the circuit board 120 are meant only for illustrate purpose of the general concept of a circuit board.

FIG. 2 is a perspective view of one embodiment of a heat sink securement apparatus 200. The depicted apparatus 200 includes a frame 210, a vertical retention arm 220, a tension arm 230, and a horizontal retention arm 240. The frame 210, the vertical retention arm 220, the tension arm 230, and the horizontal retention arm 240 enable insertion, securement, and removal of the heat sink 130.

The vertical retention arm 220 vertically secures the heat sink 130 to the frame 210. The horizontal retention arm 240 horizontally secures the heat sink 130 against the back bracket 214 of the frame 210. The frame 210 may also include lateral brackets 212 for securing the heat sink 130 laterally within the frame 210.

In certain embodiments, the frame 210 may also include break 242 for horizontal stabilization of the heat sink 130. In such embodiments, the inward, horizontal motion of the horizontal retention arm 240 may push, slide, rock, or otherwise shift the break 242 horizontally to engage the heat sink 130. The arms 220, 230, and 240, may be of a variety of materials including stainless steel. Similarly, the frame 210 may be made of a variety of sufficiently strong materials including aluminum or zinc. Accordingly, the retention arms 220, 240 and the frame 210 cooperate to secure the heat sink 130 (see FIG. 1) vertically, horizontally, and laterally.

The tension arm 230 adjusts the tension of the vertical retention arm 220 and horizontal retention arm 240. In certain embodiments, the total pressure upon the secured heat sink 130 is approximately ten (10) to forty (40) pounds per square inch (psi). The tension arm 230 is pivotally coupled 260 to the frame 210. The tension arm 230 includes a coupling member such as a loop that is offset from the pivot point 260. The vertical and horizontal retention arms 220, 240 are coupled to the loop 250 of the tensions arm 230. Consequently, the tension of the retention arms 220, 240 adjust according to the rotation of the tension arm 230 and the relative position of the coupling loop 250 to the pivot point 260.

The frame 210 may be secured to the chassis in various ways including the use of stand off legs 216. In certain embodiments, the stand off legs 216 of the frame 210 engage the stand offs of the chassis 110 (see FIG. 1). As suggested in the description of FIG. 1 above, securing the frame 140 to the chassis 110 instead of the circuit board 120 ensures the stability of overall system 100 in addition to avoiding unnecessary stress on the circuit board 120.

FIGS. 3a-3e are perspective views of one embodiment of a heat sink securement apparatus 300. The depicted FIGS. 3a-3e viewed sequentially illustrate the insertion and securement of a heat sink 350 within the heat sink securement apparatus 300. Removal of the heat sink 350 includes a reversal of the insertion and securement steps. For purposes of differentiation between various element positions, each element identifier in the following discussion as appended with a letter that matches the corresponding Figure.

Referring to FIG. 3a, the heat sink 350a may be inserted into frame 310a via the direction 352a. The vertical retention arm 320a, the horizontal retention arm 340a, and the tension arm 330a are in a substantially horizontal position to provide sufficient space whereby the heat sink 350a may be inserted into the frame 310a. Consequently, the loop 332a of the tension arm 330a is rotated substantially downward with respect to the pivot point 334a. When fully inserted, the heat sink 350a resides within the frame 310a. In certain embodiments, the bottom surface of the heat sink 350a does not touch the frame 310a, but sits on top of the integrated circuit 360a instead.

Figure 3C:
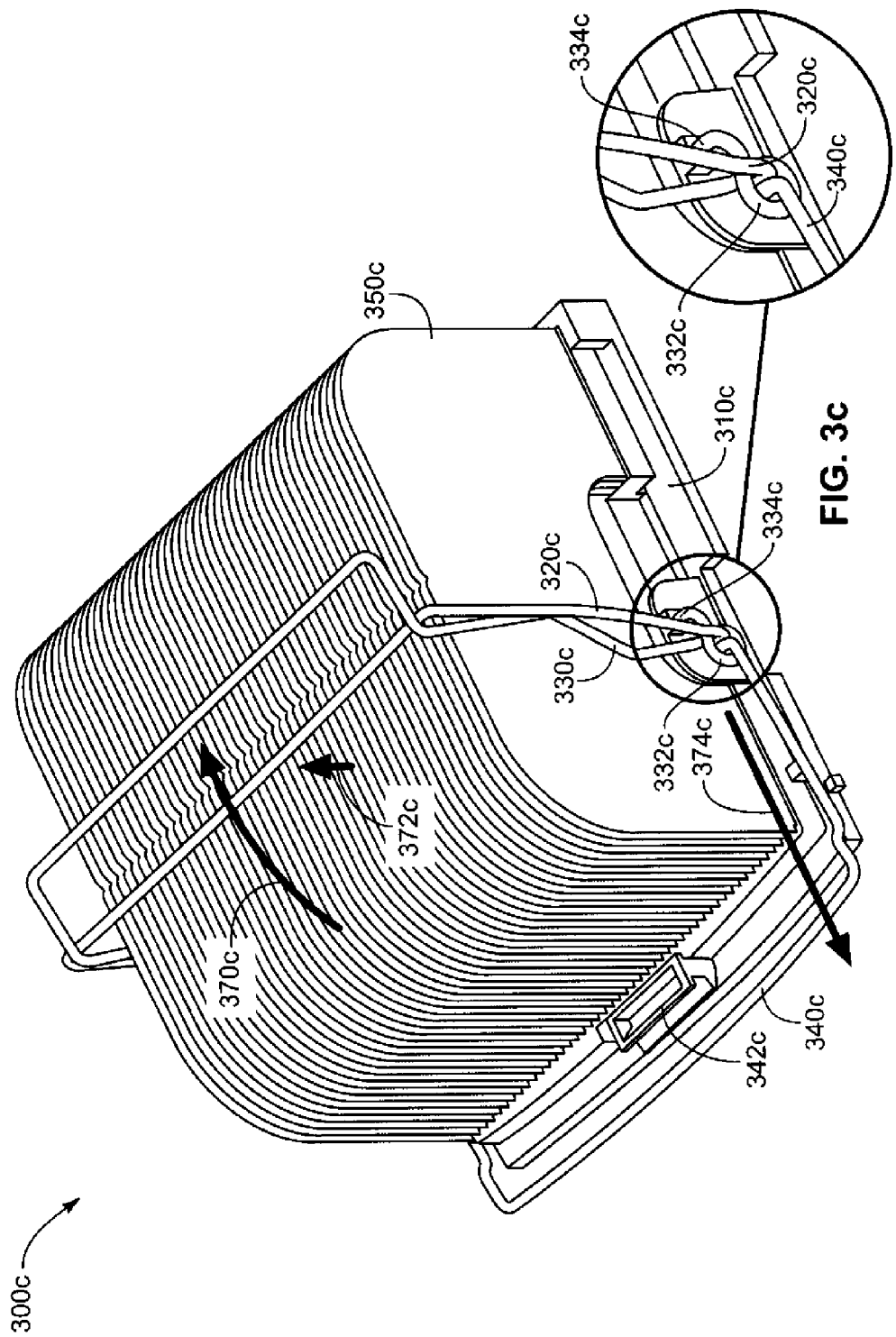

Referring to FIG. 3b, once the heat sink 350b is positioned within the frame 310b, the vertical retention arm 320b and the tension arm 330b may be rotated upward in the direction 370b. As depicted in FIG. 3c, the vertical arm 320c and tension arm 330c may be rotated to a substantially vertical position. It should be noted that the loop 332c of the tension arm 330c similarly rotates from a downward position (see FIG. 3a) to a position more horizontal with the pivot point 334c. Consequently, as the vertical retention arm 320c is coupled to the loop 332c of the tension arm 330c, the vertical retention arm 320c shifts upward in the direction 372c. Similarly, because the horizontal retention arm 340c is coupled to the loop 332c, the horizontal retention arm 340c shifts in the direction 374c as the loop 332c is now in a more horizontal position than seen in FIG. 3b.

Figure 3D:
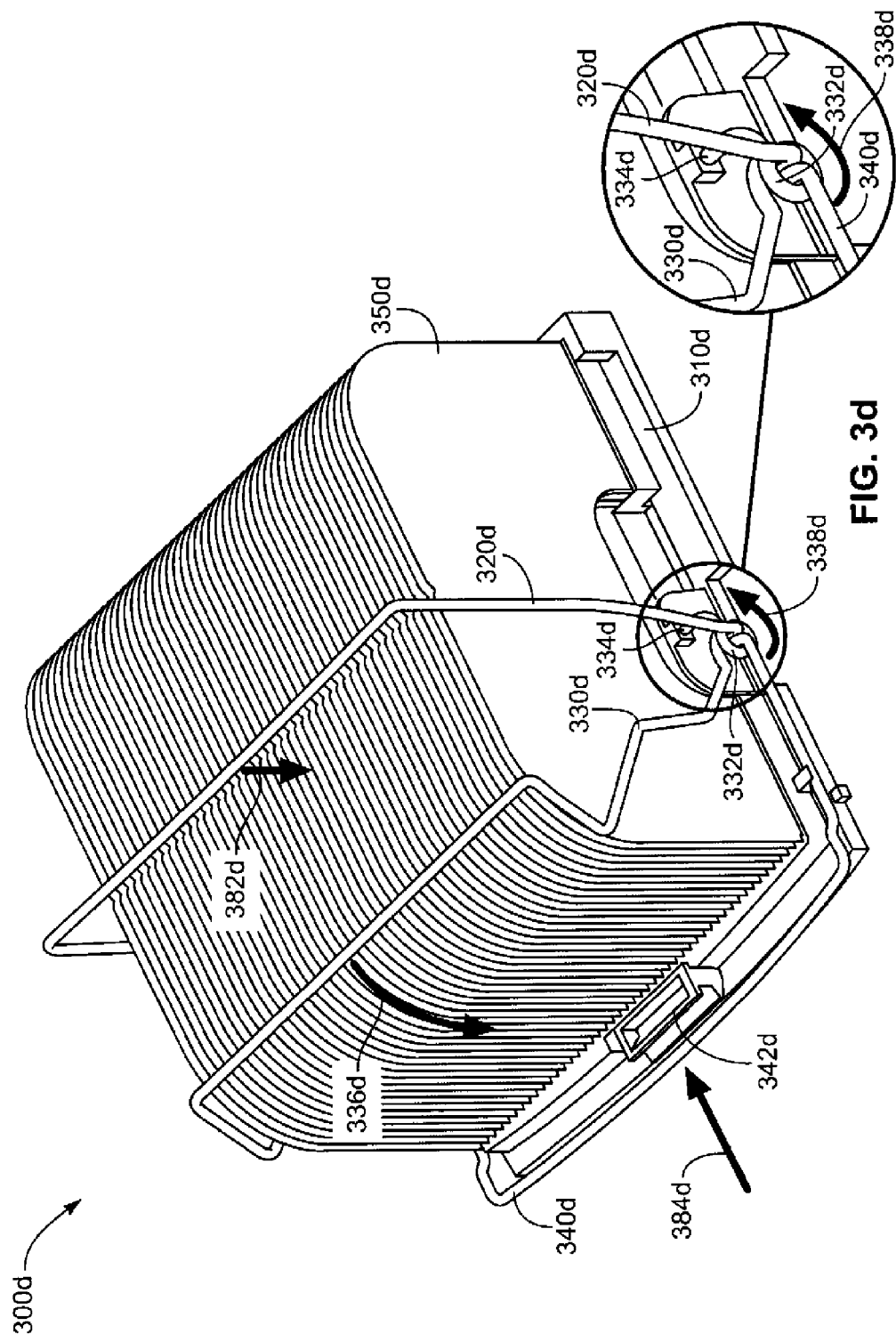

Referring to FIG. 3d, once the vertical arm 320d is in a substantially vertical position, the tension arm 330d may be rotated downward in the direction 336d which in turn rotates the loop 332d in the direction and lowers the vertical retention arm 320d in the direction 382d, to secure the heat sink 350d vertically against the integrated circuit 360a (see FIG. 3a). In addition to shifting the position of the vertical arm 320d, rotating the tension arm 330d also shifts the horizontal retention arm 340d and, consequently, the break 342d, in the direction 384d. In certain embodiments, the pivotal coupling relationship between the vertical retention arm 320d, the tension arm 330d, and the horizontal retention arm 340d is such that, when the tension arm 330d is rotated downward in the direction 336d, the vertical retention arm 320d actually engages and secures the heat sink 350d vertically before the horizontal retention arm 340d and break 342d engage the heat sink 350d horizontally.

As seen in FIG. 3e, once the tension arm 330e is in a substantially horizontal position as depicted, the position of the loop 332e is such that both the vertical and horizontal retention arms 320e, 240e are applying pressure against the heat sink 350e and thereby securing the heat sink 350e to the integrated circuit 360a (see FIG. 3a). It should be noted that the depicted position of the loop 332e is beyond the point of maximum vertical tension corresponding to the illustrative line 392e which vertically intersects the pivot point 334e. In a position beyond the point of maximum tension, if vertical outward pressure is placed upon the heat sink 350e, the pivot 334e and loop 332e will tend to rotate in the direction 390e. However, such rotation is inhibited since the tension arm 330e cannot rotate any further. In other words, because the loop 332e has rotated beyond the center of the pivot point 334e, applying outward, vertical pressure on the heat sink 350e essentially locks the heat sink 350e within the frame 310e. Having the loop 332e offset from the pivot point 334e of the tension arm 330e provides a point of maximum tension and a locking effect for positions beyond the point of maximum tension. A horizontal version of this beyond center principle is taught and enabled specifically in FIG. 5.

Figure 4:
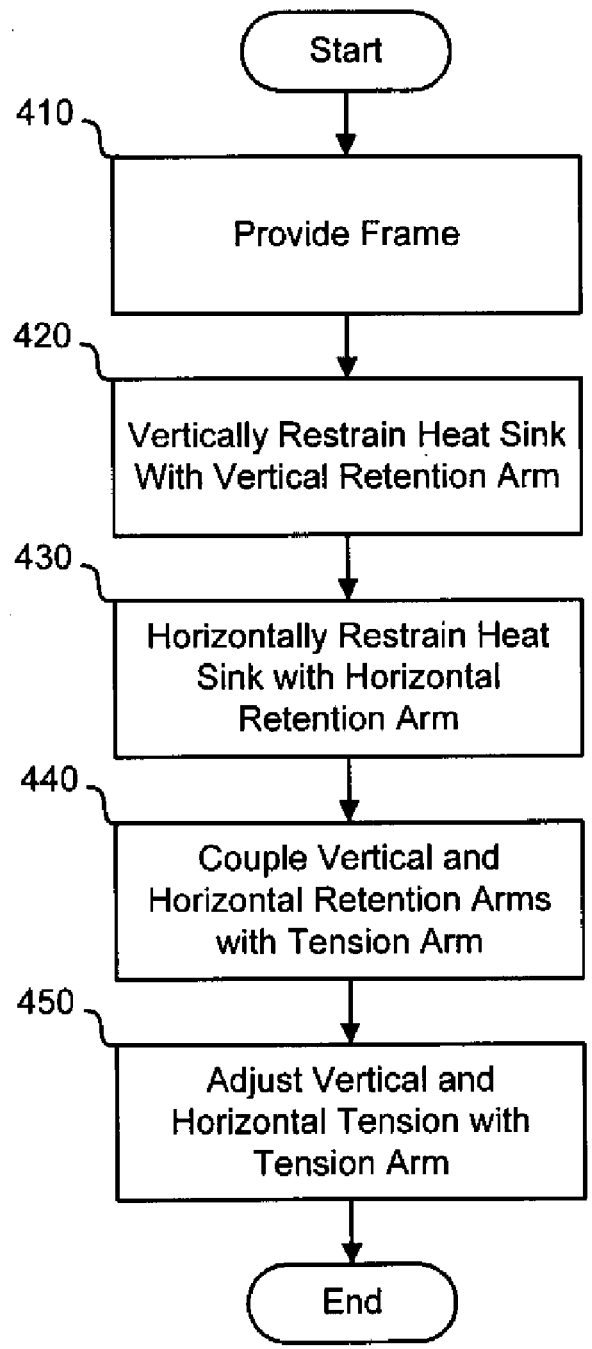
FIG. 4 is a schematic flow diagram illustrating one embodiment of a method for securing a heat sink to a against a central processing unit in accordance with the present invention.

FIG. 4 is a schematic flow diagram illustrating one embodiment of a method for securing a heat sink 350a against an integrated circuit 360a. The depicted method 400 includes providing 410 a frame, vertically encompassing 420 a heat sink with a vertical retention arm, horizontally encompassing 430 the heat sink with a horizontal retention arm, coupling 440 the vertical and horizontal retention arms with a tension arm, adjusting 450 the vertical and horizontal tension arms with the tension arm. The steps in the depicted method 400 function to secure a heat sink against a CPU.

In certain embodiments, coupling 440 the vertical and horizontal retention arms with a tension arm includes coupling the vertical and horizontal retention arms with a coupling member of the tension arm. In certain embodiments, the coupling member may be a loop. The coupling member may be offset from a pivot point of the tension arm to enable an over the center feature of the tension arm. Additionally, as depicted, the coupling member may follow a substantially semi-circular path in response to engaging the tension arm.

Vertically restraining 420 a heat sink in a vertical direction with a vertical retention arm may include using a vertical retention arm that is pivotally coupled to the tension arm. Horizontally restraining 430 a heat sink with a horizontal retention arm may include using a horizontal retention arm that is coupled to the tension arm. In certain embodiments, providing a frame 410 includes providing a horizontal brake configured to oppose horizontal motion of a heat sink.

Figure 5:
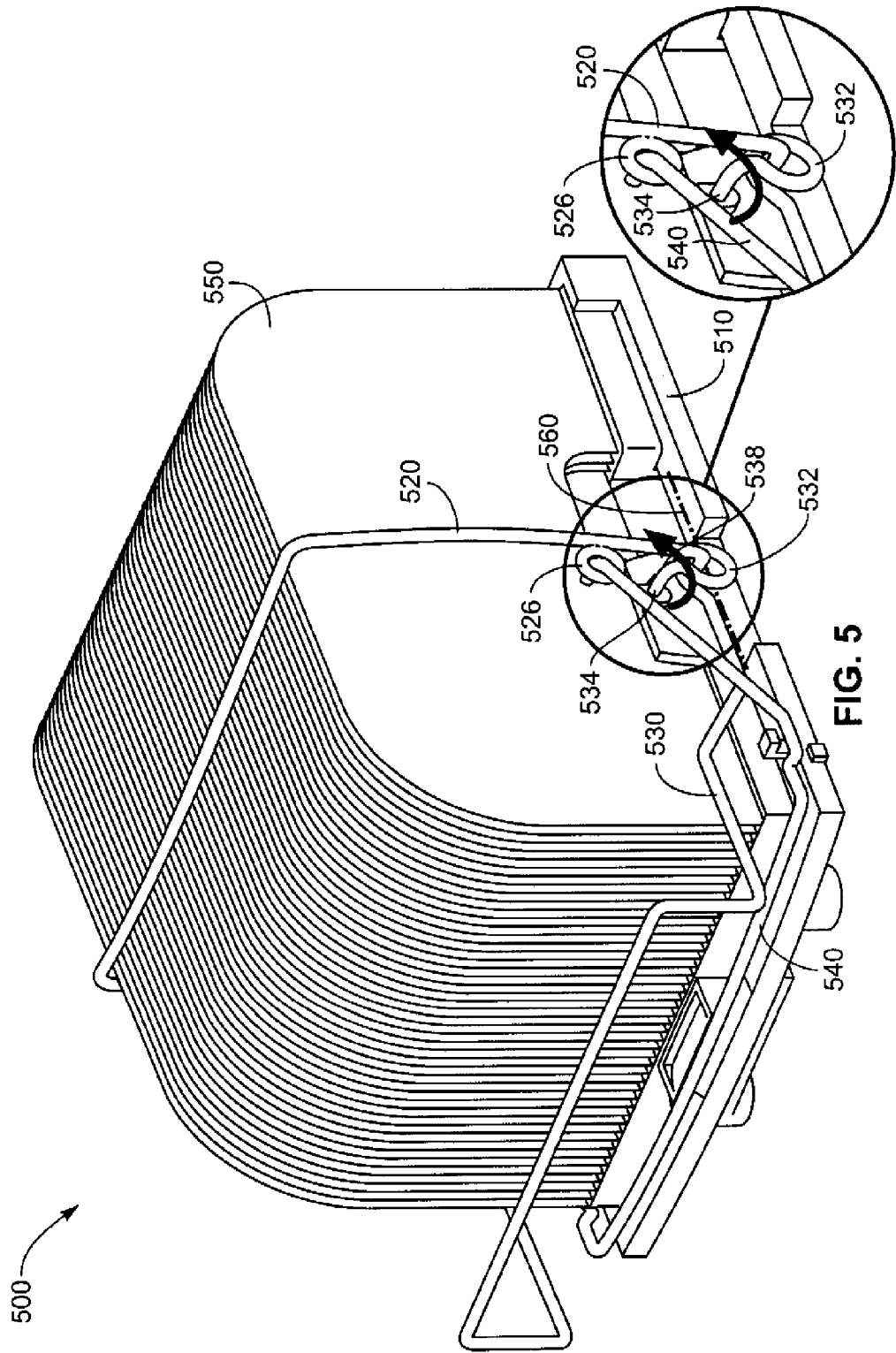
FIG. 5 is a perspective view of one embodiment of a heat sink securement apparatus in accordance with the present invention.

FIG. 5 is a perspective view of one embodiment of a heat sink securement apparatus 500. The depicted apparatus 500 includes an integrated circuit base 510, a vertical retention arm 520, a tension arm 530, and a horizontal retention arm 540. The tension arm 530 also includes a first coupling member, in the form of a loop 532, for coupling the vertical retention arm 520. The loop 532 pivots about the pivot point 534 as the tension arm 530 is rotated. The vertical retention arm 520 also includes a coupling member in the form of a second loop 526 for coupling the horizontal retention arm 540.

As the horizontal retention arm 540 is coupled to the vertical retention arm 520, as the vertical retention arm 520 is originally rotated from a substantially horizontal position (see FIG. 3a) to a substantially vertical position (as depicted) the horizontal arm adjust according to the changing position of the second loop 526 and is, consequently, adjusted horizontally inward to the current depicted position. Because the horizontal retention arm 540 is coupled to the secured vertical retention arm 520 above the pivot point 534 of the tension arm 530, any outward horizontal pressure will further secure the heat sink to the frame 510 because the point of maximum tension of the vertical arm as explained in FIG. 3e.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for securing a heat sink against an integrated circuit, the apparatus comprising:
    a frame;
    a vertical retention arm configured to restrain a heat sink in a vertical direction;
    a horizontal retention arm configured to restrain the heat sink in a horizontal direction; and
    a tension arm pivotally affixed directly to the frame at a pivot point, the tension arm comprising a coupling member coupled to the vertical and horizontal retention arms, the coupling member pivotally offset from the pivot point providing a point of maximum tension and a locking effect for positions beyond the point of maximum tension and thereby configured to simultaneously adjust a tension on the vertical retention arm and the horizontal retention arm in response to rotating the tension arm about the pivot point.

2. The apparatus of claim 1, wherein the frame comprises a pair of lateral brackets disposed on opposite sides of the frame, the lateral brackets configured to restrain the heat sink in a lateral direction, wherein the lateral direction is perpendicular to the horizontal direction and the vertical direction.

3. The apparatus of claim 1, wherein the frame comprises multiple stand off legs.

4. The apparatus of claim 1, wherein the coupling member follows a semi-circular path in response to adjusting the tension arm.

5. The apparatus of claim 4, wherein the coupling member is configured to not pivot past a lowest point in the semi-circular path and thereby maintain tension on the vertical arm.

6. The apparatus of claim 1, wherein the coupling member of the tension arm comprises a first coupling loop in the tension arm configured to couple with the vertical retention arm and the vertical retention arm comprises a second coupling member configured to couple with the horizontal retention arm such that the tension arm is coupled to the horizontal arm via the vertical retention arm.

7. The apparatus of claim 1, wherein the vertical retention arm is pivotally coupled to the tension arm.

8. The apparatus of claim 1, wherein the coupling member is a loop in the tension arm.

9. The apparatus of claim 1, wherein the frame comprises a horizontal brake coupled to the frame and configured to oppose horizontal motion of the heat sink.

10. A system for securing a heat sink against an integrated circuit, the system comprising:
    an integrated circuit;
    a frame;
    a heat sink; and
    a heat sink securement device comprising:
        a vertical retention arm configured to restrain the heat sink in a vertical direction;
        a horizontal retention arm configured to restrain the heat sink in a horizontal direction; and
        a tension arm pivotally affixed directly to the frame at a pivot point, the tension arm comprising a coupling member coupled to the vertical and horizontal retention arms, the coupling member pivotally offset from the pivot point providing a point of maximum tension and a locking effect for positions beyond the point of maximum tension and thereby configured to simultaneously adjust a tension on the vertical retention arm and the horizontal retention arm in response to rotating the tension arm about the pivot point.

11. The system of claim 10, wherein the integrated circuit and the frame are disposed on a printed circuit board.

12. The system of claim 11, wherein the printed circuit board is physically supported by a computer chassis.

13. The system of claim 10, wherein the integrated circuit is connected to a power supply.

* * * * *